United States Patent
Yang et al.

(10) Patent No.: US 9,466,738 B2
(45) Date of Patent: Oct. 11, 2016

(54) SOLAR CELL METALLIZATIONS CONTAINING METAL ADDITIVE

(75) Inventors: Yi Yang, San Diego, CA (US); Aziz S. Shaikh, San Diego, CA (US); Srinivasan Sridharan, Strongsville, OH (US)

(73) Assignee: Heracus Precious Metals North America Conshohocken LLC, West Conshohocken, PA (US)

( * ) Notice: Subject to any disclaimer, the term of this patent is extended or adjusted under 35 U.S.C. 154(b) by 252 days.

(21) Appl. No.: 13/881,395

(22) PCT Filed: Oct. 27, 2011

(86) PCT No.: PCT/US2011/057963
§ 371 (c)(1),
(2), (4) Date: Jul. 8, 2013

(87) PCT Pub. No.: WO2012/058358
PCT Pub. Date: May 3, 2012

(65) Prior Publication Data
US 2013/0277624 A1 Oct. 24, 2013

Related U.S. Application Data (60) Provisional application No. 61/407,588, filed on Oct. 28, 2010.

(51) Int. Cl.
*H01B 1/02* (2006.01)
*H01B 1/12* (2006.01)
(Continued)

(52) U.S. Cl.
CPC ......... *H01L 31/022425* (2013.01); *H01B 1/22* (2013.01); *Y02E 10/50* (2013.01)

(58) Field of Classification Search
CPC .............. H01L 31/1804; H01L 31/022425; H01B 1/22
USPC .............. 252/506, 514, 519.21; 136/243
See application file for complete search history.

(56) References Cited

U.S. PATENT DOCUMENTS 5,503,777 A * 4/1996 Itagaki et al. ............ 252/519.21
6,071,437 A * 6/2000 Oya .......................... H01B 1/16
136/243

(Continued)

FOREIGN PATENT DOCUMENTS

EP 1713095 A2 10/2006
JP 6249676 A 3/1987

(Continued)

OTHER PUBLICATIONS

International Search Report; International Application No. PCT/US2011/057963; International Filing Date: Oct. 27, 2011; 2 pages.

*Primary Examiner* — Khanh Tuan Nguyen
(74) *Attorney, Agent, or Firm* — Blank Rome LLP; Charles R. Wolfe, Jr.; Jamie L. Tesfazion (57) ABSTRACT

Paste compositions, methods of making a paste composition, and methods of making a solar cell contact are disclosed. The paste composition can contain silver, a glass frit, a metal additive and an organic vehicle system. The metal additive is at least one selected from the group consisting of yttrium, an organo-vanadium compound, organo-antimony compound, organo-phosphorus compound, and an organo-yttrium compound. The paste can be used for making a solar cell contact.

20 Claims, 3 Drawing Sheets

(51) Int. Cl.
*H01L 31/0224* (2006.01)
*H01B 1/22* (2006.01)

(56) References Cited

U.S. PATENT DOCUMENTS

| | | |
|---|---|---|
| 2006/0001009 A1 | 1/2006 | Garreau-Iles et al. |
| 2006/0102228 A1 | 5/2006 | Sridharan et al. |
| 2006/0289055 A1 | 12/2006 | Sridharan et al. |
| 2009/0095344 A1* | 4/2009 | Machida ............... C03C 8/02 136/252 |
| 2009/0266409 A1 | 10/2009 | Wang et al. |
| 2010/0021625 A1* | 1/2010 | Dorfman ............... C08K 3/08 427/75 |
| 2010/0163101 A1 | 7/2010 | Kumar et al. |
| 2010/0173446 A1 | 7/2010 | Khadilkar et al. |
| 2010/0247798 A1 | 9/2010 | Chung et al. |
| 2011/0000531 A1 | 1/2011 | Kwag et al. |
| 2012/0161081 A1* | 6/2012 | Kleine Jaeger et al. ..... 252/506 |

FOREIGN PATENT DOCUMENTS

| | | |
|---|---|---|
| JP | 2006016298 A | 1/2006 |
| JP | 2006332032 A | 12/2006 |
| JP | 2008543080 A | 11/2008 |
| JP | 2010526414 A | 7/2010 |
| WO | WO-2008014677 A1 | 2/2008 |
| WO | WO-2009134646 A1 | 11/2009 |

* cited by examiner

SOLAR CELL METALLIZATIONS CONTAINING METAL ADDITIVE

TECHNICAL FIELD

The subject disclosure generally relates to a paste composition, a method of making a paste composition, a method of making a solar cell contact, and a fired front contact that can be used in solar cells as well as other related components.

BACKGROUND

Solar cells are generally made of semiconductor materials, such as silicon (Si), which convert sunlight into useful electrical energy. Solar cells are typically made of thin wafers of Si in which the required PN junction is formed by diffusing phosphorus (P) from a suitable phosphorus source into a P-type Si wafer. The side of silicon wafer on which sunlight is incident is in general coated with an anti-reflective coating (ARC) to prevent reflective loss of incoming sunlight, and thus to increase the efficiency of the solar cell. A two dimensional electrode grid pattern known as a front contact makes a connection to the N-side of silicon, and a coating of aluminum (Al) on the other side (back contact) makes connection to the P-side of the silicon. These contacts are the electrical outlets from the PN junction to the outside load.

Front contacts of silicon solar cells are formed by screen-printing a thick film paste. Typically, the paste contains approximately fine silver particles, glass and organics. After screen-printing, the wafer and paste are fired in air, typically at furnace set temperatures. During the firing, glass softens, melts, and reacts with the anti-reflective coating, etches the silicon surface, and facilitates the formation of intimate silicon-silver contact. Silver deposits on silicon as islands. The shape, size, and number of silicon-silver islands determine the efficiency of electron transfer from silicon to the outside circuit.

SUMMARY

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

In accordance with one aspect, a paste composition is provided. More particularly, in accordance with this aspect, the paste composition includes silver, a glass frit, and a metal additive. The metal additive is at least one selected from the group consisting of yttrium, an organo-vanadium compound, organo-antimony compound, organo-phosphorus compound, and organo-yttrium compound. In addition, along with the foregoing metal additive, at least one of the following organo-metal additives selected from the group of metal of Co, Ni, Sn, Zr, Li, and Zn may also be included in the paste.

In accordance with another aspect, a method of making a paste composition is provided. More particularly, in accordance with this aspect, the method involves combining silver, a glass frit, and a metal additive with an organic vehicle and dispersing the silver, the glass frit, and the metal additive in the organic vehicle.

In accordance with yet another aspect, a method of making a solar cell contact is provided. More particularly, in accordance with this aspect, the method involves applying a paste to a silicon substrate, the paste containing silver particles, a glass frit, and a metal additive. The method further involves heating the paste to sinter the silver particles and fuse the glass frit.

In accordance with still yet another aspect, a fired front contact is provided. More particularly, in accordance with this aspect, the fired front contact includes silver, a glass frit, and yttrium.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention can be employed. Other objects, advantages and novel features of the invention will become apparent from the following detailed description of the invention when considered in conjunction with the drawings.

BRIEF DESCRIPTION OF THE DRAWINGS

10: p-type silicon substrate
20: n-type diffusion layer
30: front side passivation layer/anti-reflective coating
40: p+ layer (back surface field (BSF))
70: first paste formed on backside
71: back electrode formed by firing first paste 70
80: second paste formed on backside
81: back electrode formed by firing second paste 80
500: front side silver/metal additive
501: silver/metal additive front electrode after firing paste 500 through ARC

DETAILED DESCRIPTION

The subject paste composition can include silver, a glass frit, and a metal additive. By way of illustration, the paste composition can contain silver at about 50 wt % or more and about 92 wt % or less of the paste composition; a glass frit at about 1 wt % or more and about 15 wt % or less of the paste composition; and a metal additive at about 0.01 wt % or more and about 5 wt % or less of the paste composition. The metal additive includes yttrium, an organo-vanadium compound, organo-antimony compound, organo-phosphorus compound, organo-yttrium compound, or combinations thereof. In one embodiment, the paste composition further includes organic binders, solvents, or combinations thereof.

The paste compositions can be used as film pastes to make, for example, front contacts for silicon-based solar cells which collect current generated by exposure to light, or to make back contacts that conduct electrons to an outside load. Cell electrical performance as measured by cell efficiency (η) and fill factor (FF) is affected by the microstructure and the electrical properties of the silver/silicon interface. The electrical properties of the solar cell are also characterized by series resistance ($R_s$) and shunt resistance ($R_{sh}$). The composition and microstructure of the front contact interface largely determine $R_s$. The subject paste compositions can provide low series resistance ($R_s$) and high shunt resistance ($R_{sh}$) to give high performance solar cells, as measured by efficiency (η) and fill factor (FF).

The paste compositions and methods of the present invention can facilitate optimized interaction, bonding, and contact formation between front contact components, typically Ag and Si, through the glass medium. The paste composition can be printed on a silicon substrate, and fired to fuse the glass and sinter the metal therein. Upon firing, Ag/Si conductive islands are formed providing conductive bridges between bulk paste and silicon wafer. When leaded glasses are used, the leaded glasses allow low fixing temperatures owing to their excellent flow characteristics relatively at low temperatures.

The paste can be applied on a substrate by any suitable technique. In one embodiment, the paste is applied by screen-printing, stencil printing, extrusion, pad printing, ink jet printing, hot melt printing, or any suitable micro-deposition direct writing techniques that one of ordinary skill in the art would recognize. The paste composition can be used to from contacts of a solar cell. The pastes are screen-printed on a substrate and the pastes formed on the substrate are fired to relatively low temperatures (550° C. to 850° C. wafer temperature; furnace set temperatures of 650° C. to 1000° C.) to form a low resistance contact between, for example, the N-side of a phosphorus doped silicon wafer and the paste composition.

Silver Component

The paste composition can contain any suitable silver compound in any suitable form. The source of the silver in the silver component can be one or more fine particles or powders of silver metal, or alloys of silver. A portion of the silver can be added as silver oxide ($Ag_2O$) or as silver salts such as $AgNO_3$, $AgOOCCH_3$ (silver acetate), Ag acrylate or Ag methacrylate. Additionally, the silver can be coated with various materials such as phosphorus. Alternately, silver can be coated on glass. Or silver oxide can be dissolved in the glass during the glass melting/manufacturing process. The silver particles used in the paste can be spherical, flaked, colloidal, irregular (having neither a spherical nor a flake morphology), or combinations thereof. Specific examples of silver particles include spherical silver powder Ag3000-1, de-agglomerated silver powder SFCGED, silver flake SF-23, nano silver powder Ag 7000-35 and colloidal silver RDAGCOLB, all commercially available from Ferro Corporation, Cleveland, Ohio.

The paste composition can include any of the aforementioned silver sources. In one embodiment, the silver portion of the paste contains spherical silver particles at about 80 wt % or more and about 100 wt % or less of the silver portion and silver flakes at about 0 wt % or more and about 20 wt % or less of the silver portion. In another embodiment, the silver portion of the paste contains silver flakes at about 75 wt % or more and about 90 wt % or less of the silver portion and colloidal silver at about 1 wt % or more and about 10 wt % or less of the silver portion. In another embodiment, the silver portion of the paste contains irregular silver metal particles at about 80 wt % or more and about 100 wt % or less of the silver portion, silver metal flakes at about 0 wt % or more and about 20 wt % or less of the silver portion, and colloidal silver metal at about 1 wt % or more and about 10 wt % or less of the silver portion.

The paste composition generally contains silver at any suitable amount so long as the paste can provide electrical conductivity. In one embodiment, the paste composition contains silver at about 50 wt % or more and about 92 wt % or less of the paste composition. In another embodiment, the paste composition contains silver at about 70 wt % or more and about 90 wt % or less of the paste composition. In yet another embodiment, the paste composition contains silver at about 75 wt % or more and about 87 wt % or less of the paste composition.

The silver particles can have any suitable size. In one embodiment, the silver particles have a median particle size of about 0.05 microns or more and about 10 microns or less. In this specification and the claims below particle size is measured using a Honeywell Microtrac X100 instrument. In another embodiment, the silver particles have a median particle size of about 0.05 microns or more and about 5 microns or less. In yet another embodiment, the silver particles have a median particle size of about 0.05 microns or more and about 3 micron or less. In another embodiment, the particles have a specific surface area of about 0.01 to 10 $g/m^2$. In another embodiment, the particles have a specific surface area of about 0.1 to 8 $g/m^2$. In another embodiment, the particles have a specific surface area of about 0.2 to 6 $g/m^2$. In another embodiment, the particles have a specific surface area of about 0.2 to 5.5 $g/m^2$. In another embodiment, the particle size distribution of the mixture of different types of silver powders in the paste (either irregular, spherical, flake, submicron or nano-silver Ag) can be a mono distribution or other type of distribution, for example a hi-modal or tri-modal distribution.

Glass Frit

The glass frits used herein are not critical and the paste composition can contain any suitable glass frits. As an initial matter, the glass frits used in the pastes herein can intentionally contain lead and/or cadmium, or they can be devoid of intentionally added lead and/or cadmium. In one embodiment, the glass frit is a substantially lead-free glass frit. In another embodiment all of the glass frits are lead and cadmium free. The glasses can be partially crystallizing or non-crystallizing. Partially crystallizing glasses are preferred. Mixture of glass frits with one or more crystallizing or partially crystallizing or non-crystallizing structures can be used. The details of the composition and manufacture of the glass frits can be found in, for example, commonly-assigned U.S. Patent Application Publication Nos. 2006/0289055 and 2007/0215202, which are hereby incorporated by reference.

Although generally avoided, substantial additions of thallium oxide or vanadium oxides can be added to these frits to attain lower temperatures. Similarly substantial amounts of tellurium oxide or germanium oxide can be added to these frits to attain lower flow temperatures.

The paste composition can include any suitable glass frit. The following tables set forth glass frit compositions useful in the practice of the invention. An entry such as $Sb_2O_5 + V_2O_5$ means that $Sb_2O_5$ or $V_2O_5$ or a combination of the two is present in the specified amount.

TABLE 1

Oxide glass frit composition in weight percent of total glass.
Glass Composition I

| Constituent | |
|---|---|
| PbO | 52-88 |
| $SiO_2$ | 0.5-15 |
| $Al_2O_3$ | 0.5-10 |
| ZnO | 0-22 |
| $Ta_2O_5$ | 0-8 |
| $ZrO_2$ | 0-10 |
| $P_2O_5$ | 0-8 |
| $Li_2O + K_2O + Na_2O$ | 0-15 |
| $B_2O_3$ | 0-12 |
| $Fe_2O_3 + Co_2O_3 + CuO + MnO_2$ | 0-25 |

TABLE 2

Lead free bismuth glass frit composition in weight percent of total glass.
Glass Composition II

| Constituent | |
|---|---|
| $Bi_2O_3$ | 55-90 |
| $B_2O_3$ | 1-15 |
| $SiO_2$ | 0-20 |
| ZnO | 0-13 |
| $K_2O$ | 0-12 |
| $LiO_2$ | 0-12 |
| $Na_2O$ | 0-12 |
| $Nb_2O_5 + Ta_2O_5$ | 0-10 |
| $Fe_2O_3 + Co_2O_3 + CuO + MnO_2$ | 0-25 |

TABLE 3

Lead free and bismuth free glass frit composition in weight percent of total glass.
Glass Composition III

| Constituent | |
|---|---|
| $B_2O_3 + SiO_2$ | 30-62 |
| ZnO | 0-34 |
| $TiO_2$ | 0-22 |
| $LiO_2$ | 0-10 |
| $Na_2O$ | 0-23 |
| $K_2O$ | 0-13 |
| $P_2O_5$ | 0-10 |
| $Sb_2O_5 + V_2O_5$ | 0-13 |
| $ZrO_2$ | 0-8 |
| F | 0-5 |
| $Fe_2O_3 + Co_2O_3 + CuO + MnO_2$ | 0-25 |

Although in these tables the oxides are denoted by the chemical formula of one of their valence states such as $Fe_2O_3$, the oxides of other valence states such as FeO, $Fe_3O_2$ are also implied by these formulae.

The frits can contain other oxides such as $MoO_3$, $WO_3$, $In_2O_3$, and/or $Ga_2O_3$ to adjust wetting and flow properties.

The paste composition can contain any suitable amount of the glass frit. In one embodiment, the paste composition contains the glass frit at about 1 wt % or more and about 15 wt % or less. In another embodiment, the paste composition contains the glass frit at about 2 wt % or more and about 10 wt % or less. In yet another embodiment, the paste composition contains the glass frit at about 2 wt % or more and about 8 wt % or less. In yet another embodiment, the paste composition contains the glass frit at about 3 wt % or more and about 6 wt % or less.

Metal Additive

The paste composition contains one or more metal additives in a variety of ways to reduce the resistance of the front contacts. The metal additive includes yttrium and organo-metal compounds. The organo-metal compounds include organo-vanadium compounds, organo-antimony compounds, organo-phosphorus compounds, and organo-yttrium compounds. That is, the metal additive is at least one selected from the group consisting of yttrium, an organo-vanadium compound, organo-antimony compound, organo-phosphorus compound, and an organo-yttrium compound. Yttrium can be in its elemental form. The organo-metal compound is a compound where metal is bound to any suitable organic moiety. For example, the organo-metal compound is an organic compound containing metal, carbon, and/or nitrogen in the molecule. Further, in addition to the foregoing metal compounds, a second metal additive selected from the group consisting of an organo-cobalt compound, an organo-nickel compound, an organo-tin compound, an organo-zirconium compound, an organo-zinc compound and an organo-lithium compound may be included in the paste composition.

The organo-metal compound can include an organo-vanadium compound, organo-antimony compound, organo-phosphorus compound, and an organo-yttrium compound. The paste composition can include an organo-vanadium compound, organo-antimony compound, organo-phosphorus compound, organo-yttrium compound or combinations thereof.

The organo-metal compound can include any suitable organic moieties in its compound. Examples of organic moieties include linear or branched, saturated or unsaturated, aliphatic, alicyclic, aromatic, araliphatic, halogenated or otherwise substituted, optionally having one or more heteroatoms such as O, N, S, or Si, and include hydrocarbon moieties such as alkyl, alkyloxy, alkylthio, or alkylsilyl moieties.

Specific examples of organo-metal compounds include metal alkoxides. The metal of the metal alkoxides can be vanadium, antimony, phosphorus, yttrium, or combinations thereof. The alkoxide moiety can have a branched or unbranched alkyl group of, for example, 1 to 20 carbon atoms. Examples of organo-vanadium compounds include vanadium alkoxides and vanadyl alkoxides. Examples of organo-antimony compounds include antimony alkoxides. Examples of organo-phosphorus compounds include phosphorus alkoxides. Examples of organo-yttrium compounds include yttrium alkoxides. Examples of organo-cobalt compounds include cobaltic alkoxides and cobaltous alkoxides. Examples of organo-nickel compounds include nickel alkoxides. Examples of organo-tin compounds include tin alkoxides. Examples of organo-zirconium compounds include zirconium alkoxides. Examples of organo-zinc compounds include zinc alkoxides. Examples of organo-lithium compounds include lithium alkoxides Examples of vanadium alkoxides include vanadium methoxide, vanadium ethoxide, vanadium propoxide, and vanadium butoxide. Examples of vanadyl alkoxides include vanadyl methoxide, vanadyl ethoxide, vanadyl propoxide, and vanadyl butoxide. In the same way, antimony alkoxides, phosphorus alkoxides, yttrium alkoxides, cobaltic alkoxides, cobaltous alkoxides, nickel alkoxidse, zirconium alkoxides, tin alkoxides, zinc alkoxides and lithium alkoxides can be used.

Other examples of organo-metal compounds include metal acetylacetonates, where the metal can be vanadium, antimony, phosphorus, yttrium, or combinations thereof. Examples of organo-vanadium compounds include vanadium acetylacetonates such as $V(AcAc)_3$ (also called vanadium(III) 2,4-pentanedionate), vanadyl acetylacetonates such as $VO(AcAc)_2$ (also called vanadium(IV) oxide bis(2,4-pentanedionate)) where (AcAc) is an acetyl acetonate (also called 2,4-pentanedionate). In one embodiment, the organo-vanadium compound is vanadium(IV) oxide bis(2,4-pentanedionate), vanadium(III) 2,4-pentanedionate, or combinations thereof. In another embodiment, the organo-vanadium compound consists of vanadium(IV) oxide bis(2,4-pentanedionate).

In the same way, antimony acetylacetonate, yttrium acetylacetonate, cobaltic acetylacetonate, cobaltous acetylacetonate, nickel acetylacetonate, zirconium acetylacetonate, dibutyltin acetylacetonate, zinc acetylacetonate and lithium acetylacetonate can be used. For example, antimony 2,4-pentanedionate, yttrium 2,4-pentanedionate, or combinations thereof can be used.

Yet other examples of organo-metal compounds include metal 2-methylhexanoates, metal 2-ethylhexanoates, and metal 2-propylhexanoates. Specific examples include vanadium 2-methylhexanoates, antimony 2-methylhexanoates, phosphorus 2-methylhexanoates, yttrium 2-methylhexanoates, cobalt 2-methylhexanoates, nickel 2-methylhexanoates, zirconium 2-methylhexanoates, tin 2-methylhexanoates, zinc 2-methylhexanoates and lithium 2-methylhexanoates, vanadium 2-ethylhexanoates, antimony 2-ethylhexanoates, phosphorus 2-ethylhexanoates, yttrium 2-ethylhexanoates, cobalt 2-ethylhexanoates, nickel 2-ethylhexanoates, zirconium 2-ethylhexanoates, tin 2-ethylhexanoates, zinc 2-ethylhexanoates, lithium 2-ethylhexanoates, vanadium 2-propylhexanoates, antimony 2-propylhexanoates, phosphorus 2-propylhexanoates, yttrium 2-propylhexanoates, cobalt 2-propylhexanoates, nickel 2-propylhexanoates, zirconium 2-propylhexanoates, tin 2-propylhexanoates, tin 2-propylhexanoates, zinc 2-propylhexanoates and lithium 2-propylhexanoates, where metal is vanadium, antimony, phosphorus, yttrium, cobalt, nickel, zirconium, tin, zinc or lithium.

Yet other examples of organo-metal compounds include metal acrylate and metal methacrylate, where metal is vanadium, antimony, phosphorus, yttrium, cobalt, nickel, zirconium, tin, zinc or lithium.

The paste composition contains the metal additive at any suitable amount. In one embodiment, the paste composition contains the metal additive at about 0.01 wt % or more and about 5 wt % or less of the paste composition. In another embodiment, the paste composition contains the metal additive at about 0.02 wt % or more and about 3 wt % or less of the paste composition. In another embodiment, the paste composition contains the metal additive at about 0.05 wt % or more and about 1 wt % or less of the paste composition. In yet another embodiment, the paste composition contains the metal additive at about 0.05 wt % or more and about 0.5 wt % or less of the paste composition.

The metal additive can be in any suitable form, for example, particles such as spherical, irregular shaped, flaked, agglomerated, or provided in a colloidal suspension, or a particle free solution, and combinations of the foregoing. When the metal additive is in the form of particle, the metal additive particles can have any suitable size. In one embodiment, the metal additive particles have a median particle size of about 0.05 microns or more and about 50 microns or less. In another embodiment, the metal additive particles have a median particle size of about 0.05 microns or more and about 10 microns or less. In yet another embodiment, the metal additive particles have a median particle size of about 0.05 microns or more and about 5 micron or less.

Inorganic/Other Additives

The paste composition can optionally contain any other additives. In one embodiment, phosphorus is added to the paste composition in a variety of ways to reduce the resistance of the front contacts. For example, certain glasses can be modified with $P_2O_5$ in the form of a powdered or fritted oxide, or phosphorus can be added to the paste by way of phosphate esters and other organo-phosphorus compounds. More simply, when the silver and/or metal additive are in the form of particles, phosphorus can be added as a coating to silver and/or metal additive particles prior to making a paste. In such case, prior to pasting, the silver and/or metal additive particles are mixed with liquid phosphorus and a solvent. For example, a blend of about 85 to about 95 wt % silver and/or metal additive particles, about 5 to about 15 wt % solvent, and about 0.1 to about 10 wt % liquid phosphorus is mixed and the solvent evaporated. Phosphorus coated silver and/or metal additive particles help ensure intimate mixing of phosphorus and silver and/or metal additive in the pastes.

Other additives such as fine silicon or carbon powder, or both, can be added to the paste to control the silver reduction and precipitation reaction. The silver precipitation at the interface or in the bulk glass can also be controlled by adjusting the firing atmosphere (e.g., firing in flowing $N_2$ or $N_2/H_2/H_2O$ mixtures). However, no special atmosphere is required. Fine low melting metal additives (e.g., elemental metallic additives as distinct from metal oxides) such as Pb, Bi, In, Ga, Sn, Ni, and Zn or alloys of each with at least one other metal can be added to provide a contact at a lower firing temperature, or to widen the firing window. Typically such metal additions are present at a rate of less than about 1 wt % of the conductive metal portion of the pastes herein. Organometallic compounds providing aluminum, barium, bismuth, magnesium, zinc, strontium, lithium and/or potassium can be used, such as, for example, the acetates, acrylates, methacrylates, formates, neodeconates, methoxides, ethoxides, methoxyethoxides, and stearates of the named metals. Potassium silicate is also a suitable source of potassium.

A mixture of (a) glasses or a mixture of (b) glasses and crystalline additives or a mixture of (c) one or more crystalline additives can be used to formulate a glass component in the desired compositional range. The goal is to reduce the contact resistance and improve the solar cell electrical performance. For example, crystalline materials such as $Bi_2O_3$, $Sb_2O_3$, $Sb_2O_5$, $In_2O_3$, $Ga_2O_3$, SnO, MgO, ZnO, $Cr_2O_3$, $Fe_2O_3$, $Pb_3O_4$, PbO, $SiO_2$, $ZrO_2$, $V_2O_5$, $Al_2O_3$, $B_2O_3$, $TiO_2$, $Nb_2O_5$, $Ta_2O_5$, $Tl_2O$, $TeO_2$ and $GeO_2$ can be added to the glass component to adjust contact properties. The foregoing oxides can be added in glassy (i.e., non-crystalline) form as well. Combinations and reaction products of the aforementioned oxides can also be suitable to design a glass component with desired characteristics. For example, low melting lead silicates, either crystalline or glassy, formed by the reaction of PbO and $SiO_2$ such as $4PbO.SiO_2$, $3PbO.SiO_2$, $2PbO.SiO_2$, $3PbO.2SiO_2$, and $PbO.SiO_2$, either singly or in mixtures can be used to formulate a glass component. Other reaction products of the aforementioned oxides such as, Bismuth silicates such as $Bi_2O_3.SiO_2$, $3Bi_2O_3.5SiO_2$, zinc silicates such as $2ZnO.SiO_2$ and $ZrO_2.SiO_2$ can also be used. Similarly niobates such as bismuth niobates, titanates such as bismuth titanates can be used. Further mineral forms of these oxides such willemite and zircon can also be added in place of reaction products. However, the total amounts of the above oxides will fall within the ranges specified for various embodiments disclosed elsewhere herein.

It is also envisioned that pigmentary reaction products of these oxides such as cobalt aluminate, cobalt silicates, black pigments such as copper iron manganese oxides can also be used as other crystalline additives.

Organic Vehicle

The paste composition can contain any suitable vehicle (e.g., carrier). The organic vehicle or carrier for most conductive compositions is typically a solution of a resin dissolved in a solvent. In one embodiment, the vehicle further contains a thixotropic agent. The solvent usually boils from about 130° C. to about 350° C. In one embodiment, the resin is ethyl cellulose. Other examples of resins include ethyl hydroxyethyl cellulose, wood rosin, gum rosin, mixtures of ethyl cellulose and phenolic resins, polymethacrylates of lower alcohols, and the monobutyl ether of ethylene glycol monoacetate.

Examples of solvents include terpenes such as alpha- or beta-terpineol or higher boiling alcohols such as Dowanol® (diethylene glycol monoethyl ether), or mixtures thereof with other solvents such as butyl Carbitol® (diethylene glycol monobutyl ether); dibutyl Carbitol® (diethylene glycol dibutyl ether), butyl Carbitol® acetate (diethylene glycol monobutyl ether acetate), hexylene glycol, Texanol® (2,2,4-trimethyl-1,3-pentanediol monoisobutyrate), as well as other alcohol esters, kerosene, and dibutyl phthalate.

In one embodiment, the organic vehicle contains organometallic compounds, for example those based on phosphorus or silver, to modify the contact. Various combinations of these and other solvents can be formulated to obtain the desired viscosity and volatility requirements for each application. Other dispersants, surfactants and rheology modifiers can be included.

Products useful in the organic carrier can be obtained commercially under any of the following trademarks: Texanol® (Eastman Chemical Company, Kingsport, Tenn.); Dowanol® and Carbitol® (Dow Chemical Co., Midland, Mich.); Triton® (Union Carbide Division of Dow Chemical Co., Midland, Mich.), Thixatrol® (Elementis Company, Hightstown N.J.), and Diffusol® (Transene Co. Inc., Danvers, Mass.), Ethyl Cellulose (Dow Chemical Company, Midland, Mich.), Terpineol, (Hercules Inc., Wilmington, Del.). N-Diffusol® is a stabilized liquid preparation containing an n-type diffusant with a diffusion coefficient similar to that of elemental phosphorus. Plasticizer® (Ferro Corporation, Cleveland, Ohio).

Hydrogenated castor oil and derivatives thereof can be used as organic thixotropic agents. A thixotrope is not always necessary because the solvent/resin properties coupled with the shear thinning inherent in any suspension can alone be suitable in this regard. Furthermore, wetting agents can be employed such as fatty acid esters, e.g., N-tallow-1,3-diaminopropane di-oleate; N-tallow trimethylene diamine diacetate; N-coco trimethylene diamine, beta diamines; N-oleyl trimethylene diamine; N-tallow trimethylene diamine; and N-tallow trimethylene diamine dioleate, and combinations thereof.

It should be kept in mind that the foregoing compositional ranges are preferred and it is not the intention to be limited to these ranges where one of ordinary skill in the art would recognize, starting with the teachings herein, that these ranges may vary depending upon specific applications, specific components and conditions for processing and forming the end products.

Paste Preparation

The paste composition can be formed by combining silver, a glass frit, and a metal additive with an organic vehicle and dispersing the silver, the glass frit, and the metal additive in the organic vehicle. The amount and type of vehicle utilized can be determined by the final desired formulation viscosity, fineness of grind of the paste, and the desired wet print thickness. In preparing compositions according to the invention, the particulate inorganic solids are mixed with the organic vehicle and dispersed with suitable equipment, such as a three-roll mill, to form a suspension, resulting in a composition for which the viscosity will be in the range of about 50 to about 200 kcps, preferably about 55 to about 120 kcps, at a shear rate of 9.6 $sec^{-1}$ as determined on a Brookfield viscometer HBT, spindle CP-51, measured at 25° C.

Printing and Firing of the Paste

The aforementioned paste compositions can be used in a process to make a contact (e.g., fired front contact film) or other components, for example, for solar cells. The method of making the contact involves (1) applying the paste composition to a silicon substrate (e.g., silicon wafer), (2) drying the paste, and (3) heating (e.g., firing) the paste to sinter the metal of the paste and make contact to silicon. The printed pattern of the paste is heated or fired at a suitable temperature, such as about 650 to about 1000° C. furnace set temperature, or about 550 to about 850° C. wafer temperature. In one embodiment, the furnace set temperature is about 750 to about 960° C., and the paste is fired in air. The antireflective $SiN_X$ layer is believed to be oxidized and corroded by the glass during firing and Ag/Si islands are formed on reaction with the Si substrate, which are epitaxially bonded to silicon. Firing conditions are chosen to produce a sufficient density of conductive metal/Si islands on the silicon wafer at the silicon/paste interface, leading to a low resistivity contact, thereby producing a high efficiency, high-fill factor solar cell.

A typical ARC is made of a silicon compound such as silicon nitride, generically $SiN_X$:H. This layer acts as an insulator, which tends to increase the contact resistance. Corrosion of this ARC layer by the glass component is hence a necessary step in front contact formation. Reducing the resistance between the silicon wafer and the paste can be facilitated by the formation of epitaxial silver/silicon conductive islands at the interface. When such an epitaxial silver/silicon interface does not result, the resistance at that interface becomes unacceptably high. The pastes and processes herein can make it possible to produce an epitaxial silver/silicon interface leading to a contact having low resistance under broad processing conditions—a minimum firing temperature as low as about 650° C., but which can be fired up to about 850° C. (wafer temperature).

The resulting fired front contact can include silver at about 50 wt % or more and about 92 wt % or less of the fired front contact; a glass frit at about 1 wt % or more and about 15 wt % or less of the fired front contact; and yttrium form at about 0.01 wt % or more and about 5 wt % or less of the fired front contact. In one embodiment, the fired front contact includes yttrium at about 0.02 wt % or more and about 3 wt % or less of the fired front contact. In another embodiment, the fired front contact can further include vanadium, antimony, phosphorus, or combinations thereof.

Method of Making Contact

A solar cell contact according to the invention can be produced by applying any conductive paste disclosed herein to a substrate, for example, by screen-printing to a desired wet thickness, e.g., from about 10 to about 80 microns. Automatic screen-printing techniques can be employed using a 200-400 mesh screen. The printed pattern is then dried at 250° C. or less, preferably about 80 to about 250° C. for about 0.5-20 minutes before firing. The dry printed pattern can be fired for as little as 1 second up to about 30 seconds at peak temperature, in a belt conveyor furnace in air. During firing, the glass is fused and the metal is sintered.

Figure 1A:
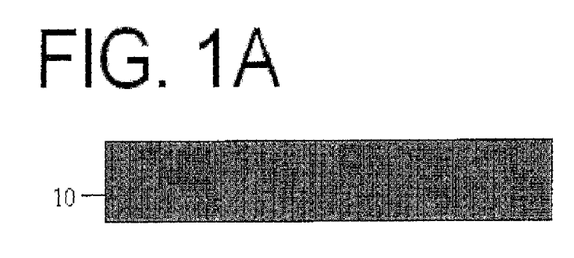
FIGS. 1A-1E illustrate a process flow diagram schematically illustrating a process of making a contact in a solar cell in accordance with an aspect of the subject invention. Reference numerals shown in FIGS. 1A-1E are explained below.

Referring now to FIGS. 1A-1E, one of many possible exemplary embodiments of making a solar cell front contact is illustrated. The solar cell front contact generally can be produced by applying the paste composition to a solar grade Si wafer. In particular, FIG. 1A schematically shows providing a substrate 10 of single-crystal silicon or multicrystalline silicon. The substrate can have a textured surface which reduces light reflection. In the case of solar cells, substrates are often used as sliced from ingots which have been formed from pulling or casting processes. Substrate surface damage caused by tools such as a wire saw used for slicing and contamination from the wafer slicing step are typically removed by etching away about 10 to 20 microns of the substrate surface using an aqueous alkali solution such as KOH or NaOH, or using a mixture of HF and $HNO_3$. The substrate optionally can be washed with a mixture of HCl and $H_2O_2$ to remove heavy metals such as iron that may adhere to the substrate surface. An antireflective textured surface is sometimes formed thereafter using, for example, an aqueous alkali solution such as aqueous potassium hydroxide or aqueous sodium hydroxide. This resulting substrate is depicted with exaggerated thickness dimensions, as a typical silicon wafer is about 160 to 200 microns thick.

Figure 1B:
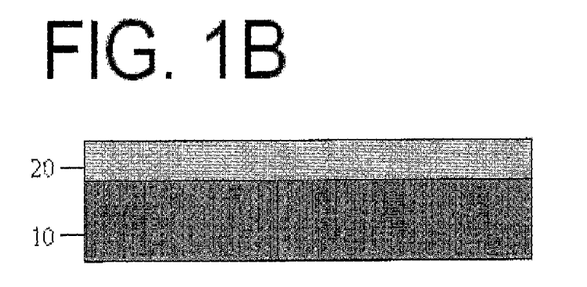

FIG. 1B schematically shows that, when a p-type substrate is used, an n-type layer 20 is formed to create a p-n junction. A phosphorus diffusion layer is supplied in any of a variety of suitable forms, including phosphorus oxychloride ($POCl_3$), organophosphorus compounds, and others disclosed herein. The phosphorus source can be selectively applied to only one side of the silicon wafer. The depth of the diffusion layer can be varied by controlling the diffusion temperature and time, is generally about 0.2 to 0.5 microns, and has a sheet resistivity of about 40 to about 120 ohms per square. The phosphorus source can include phosphorus-containing liquid coating material such as phosphosilicate glass (PSG). The phosphorus source can be applied onto only one surface of the substrate by a process such as spin coating, where diffusion is effected by annealing under suitable conditions.

Figure 1C:
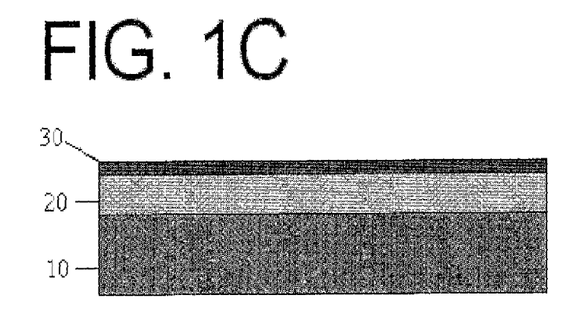

FIG. 1C illustrating forming an antireflective coating (ARC)/passivating film 30 over the substrate 10. The antireflective coating (ARC)/passivating film 30, which can be $SiN_X$, $TiO_2$ or $SiO_2$, is formed over the above-described n-type diffusion layer 20. Silicon nitride film is sometimes expressed as $SiN_X$:H to emphasize passivation by hydrogen. The ARC 30 reduces the surface reflectance of the solar cell to incident light, increasing the electrical current generated. The thickness of ARC 30 depends on its refractive index, although a thickness of about 700 to about 900 Å is suitable for a refractive index of about 1.9 to about 2.0. The ARC can be formed by a variety of procedures including low-pressure CVD, plasma CVD, or thermal CVD. When thermal CVD is used to form a $SiN_X$ coating, the starting materials are often dichlorosilane ($SiCl_2H_2$) and ammonia ($NH_3$) gas, and film formation is carried out at a temperature of at least 700° C. When thermal CVD is used, pyrolysis of the starting gases at the high temperature results in the presence of substantially no hydrogen in the silicon nitride film, giving a substantially stoichiometric compositional ratio between the silicon and the nitrogen—$Si_3N_4$. Other methods of forming an ARC can be used.

Figure 1D:
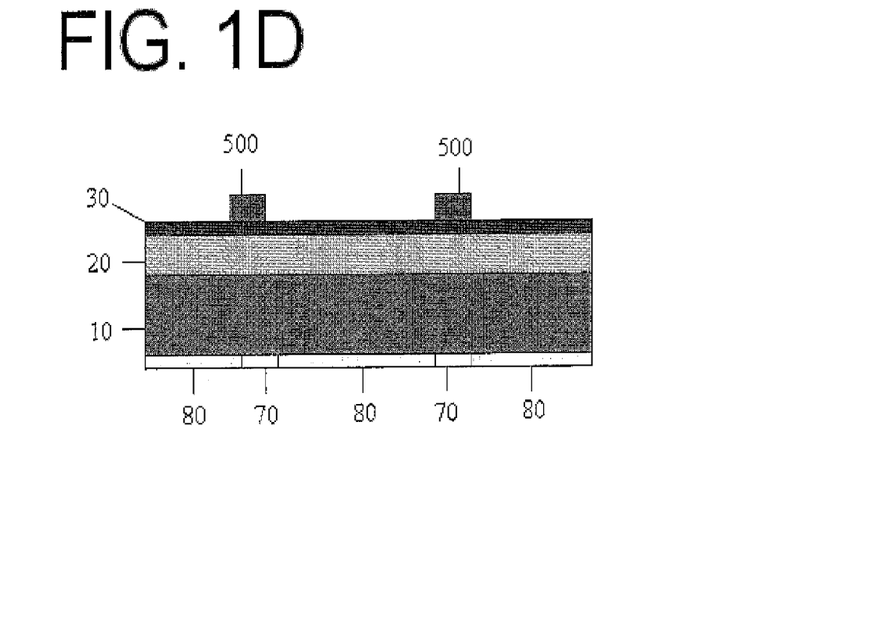

FIG. 1D illustrates applying the subject paste composition 500 over the ARC film 30. The paste composition can be applied by any suitable technique. For example, the paste composition can be applied by screen print on the front side of the substrate 10. The paste composition 500 is dried at about 125° C. for about 10 minutes. Other drying times and temperatures are possible so long as the paste vehicle is dried of solvent, but not combusted or removed at this stage.

FIG. 1D further illustrates forming a layer of back side pastes over the back side of the substrate 10. The back side paste layer can contain one or more paste compositions. In one embodiment, the first paste 70 facilitates forming a back side contact and a second paste 80 facilitates forming a p+ layer over the back side of the substrate. The first paste 70 can contain silver or silver/aluminum and the second paste 80 can contain aluminum. An exemplary backside silver/aluminum paste is Ferro 3398, PS 33-610 or PS 33-612, commercially available from Ferro Corporation, Cleveland, Ohio. An exemplary commercially available backside aluminum paste is Ferro AL53-120 Standard, or AL53-112, AL860, AL5116, commercially available from Ferro Corporation, Cleveland, Ohio.

The back side paste layer can be applied to the substrate and dried in the same manner as the front paste layer 500. In this embodiment, the back side is largely covered with the aluminum paste, to a wet thickness of about 30 to 50 microns, owing in part to the need to form a thicker p+ layer in the subsequent process.

The wafer bearing the dried pastes is then fired in an infrared belt furnace, using an air atmosphere, at a furnace set temperature of about 650° C. to about 1000° C. for a period of from about one to several minutes. The firing is generally carried out according to a temperature profile that will allow burnout of the organic matter at about 300° C. to about 550° C., a period of peak furnace set temperature of about 650° C. to about 1000° C., lasting as little as about 1 second, although longer firing times as high as 1, 3, or 5 minutes are possible when firing at lower temperatures.

Firing is typically done in an air atmosphere. For example a six-zone firing profile can be used, with a belt speed of about 1 to about 6.4 meters (40-250 inches) per minute, preferably 5 to 6 meters/minute (about 200 to 240 inches/minute). In a preferred example, zone 1 is about 18 inches (45.7 cm) long, zone 2 is about 18 inches (45.7 cm) long, zone 3 is about 9 inches (22.9 cm) long, zone 4 is about 9 inches (22.9 cm) long, zone 5 is about 9 inches (22.9 cm) long, and zone 6 is about 9 inches (22.9 cm) long. The temperature in each successive zone is typically, though not always, higher than the previous, for example, 350-500° C. in zone 1, 400-550° C. in zone 2, 450-700° C. in zone 3, 600-750° C. in zone 4, 750-900° C. in zone 5, and 800-970° C. in zone 6. Naturally, firing arrangements having more than 3 zones are envisioned by the invention, including 4, 5, 6, 7, 8 or 9 zones or more, each with zone lengths of about 5 to about 20 inches and firing temperatures of 650 to 1000° C.

Figure 1E:
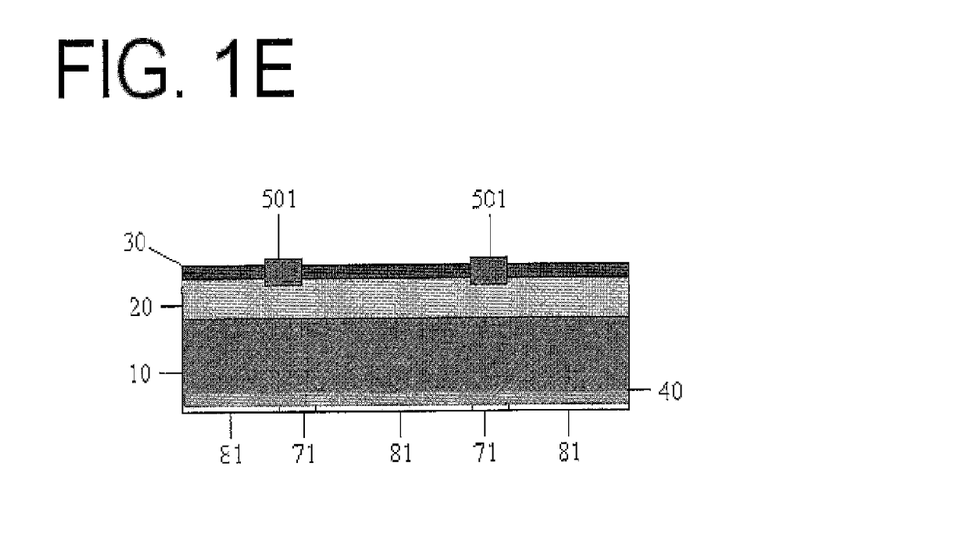

FIG. 1E illustrates sintering the metal portions of the paste 500 and fusing the glass frits of the paste 500, thereby making electrical contacts 501. As schematically shown in FIG. 1E, during firing, the front side paste 500 sinters and penetrates (i.e., fires through) the silicon nitride layer 30 and thereby makes electrical contact 501 with the n-type layer 20. The paste 80 containing aluminum over the back side melts and reacts with the silicon wafer 10, during firing, then solidifies to form a partial p+ layer 40 containing a high concentration of Al dopant. This layer is generally called the back surface field (BSF) layer, and helps to improve the energy conversion efficiency of the solar cell. A back electrode 81 can be formed by firing the paste 80. The paste 70 containing silver or silver/aluminum is fired becoming a back contact. The areas of the back side paste 71 can be used for tab attachment during module fabrication. Processes of making the pastes, solar cell contacts and solar cells disclosed herein are envisioned as embodiments of the invention.

Figure 2:
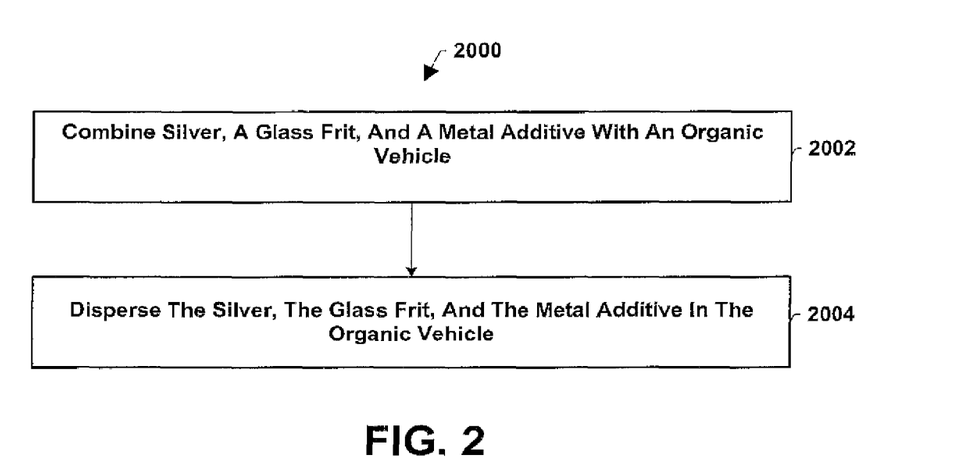
FIG. 2 is a flow diagram of an exemplary methodology of making a paste composition in accordance with an aspect of the subject invention.

FIG. 2 illustrates an exemplary methodology 2000 of making a paste composition. At 2002, silver, a glass frit, and a metal additive are combined with an organic vehicle. At 2004, the silver, the glass frit, and the metal additive are dispersed in the organic vehicle.

Figure 3:
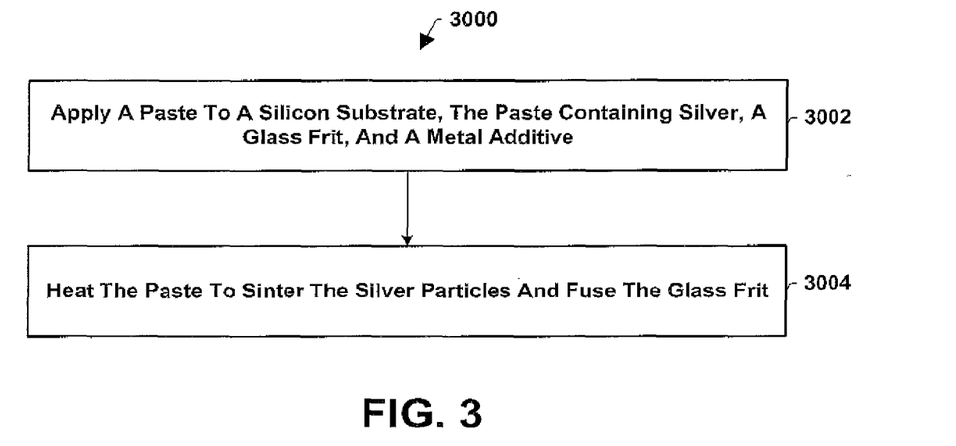
FIG. 3 is a flow diagram of an exemplary methodology of making a solar cell contact in accordance with an aspect of the subject invention.

FIG. 3 illustrates an exemplary methodology 3000 of making a solar cell contact. At 3002, a paste is applied to a silicon substrate. The paste can contain silver particles, a glass frit, and a metal additive. At 3004, the paste is heated to sinter the silver particles and fuse the glass frit.

Although not shown in FIGS. 2 and 3, the methodologies can involve one or more of the following features. The paste contains silver at about 50 wt % or more and about 92 wt % or less of the paste composition; a glass frit at about 1 wt % or more and about 15 wt % or less of the paste composition; and a metal additive at about 0.01 wt % or more and about 5 wt % or less of the paste composition. The paste contains the metal additive at about 0.02 wt % or more and about 3 wt % or less of the paste composition. The paste contains the metal additive at about 0.05 wt % or more and about 1 wt % or less of the paste composition.

The metal additive comprises one or more organo-metal compounds selected from a group consisting of vanadium alkoxides, vanadyl alkoxides, antimony alkoxides, phosphorous alkoxides, yttrium alkoxides, cobaltic alkoxides, cobaltous alkoxides, nickel alkoxidse, zirconium alkoxides, tin alkoxides, zinc alkoxides and lithium alkoxides. The metal additive comprises one or more organo-metal compounds selected from a group consisting of vanadium acetylacetonates, vanadyl acetylacetonates, antimony acetylacetonates, yttrium acetylacetonates, cobaltic acetylacetonate, cobaltous acetylacetonate, nickel acetylacetonate, zirconium acetylacetonate, dibutyltin acetylacetonate, zinc acetylacetonate and lithium acetylacetonate The metal additive comprises one or more organo-metal compounds selected from a group consisting of metal 2-methylhexanoate, metal 2-ethylhexanoate, and metal 2-propylhexanoate where metal is vanadium, antimony, phosphorus, yttrium, cobalt, nickel, zirconium, tin, zinc or lithium.

The metal additive consists of vanadium acetylacetonates, vanadyl acetylacetonates, or combinations thereof. The metal additive consists of vanadyl acetylacetonates.

EXPERIMENTAL EXAMPLES

The following examples illustrate the subject invention. Unless otherwise indicated in the following examples and elsewhere in the specification and claims, all parts and percentages are by weight, all temperatures are in degrees Celsius, and pressure is at or near atmospheric pressure.

Polycrystalline silicon wafers, 15.6 cm×15.6 cm, thickness of 150 to 250 microns are coated with a silicon nitride antireflective coating. The sheet resistivity of these wafers is about 55-80 Ω/square. The paste compositions as indicated in Tables 7 and 8 are formulated into pastes and the pastes are applied on the silicon wafers, respectively. In Table 7, silver particles having a median particle size of about 0.05 to 3.5 microns are used. In Table 8, the silver powder mixture 1 is a mixture of Ferro Ag powders with bimodal size distribution, with a medium particle size of 1 to 4 microns (81 wt %) and submicron Ag suspension with a medium particle size of 0.2 to 0.6 microns. (3 wt %), the silver powder mixture 2 is a mixture of Ferro Ag powders with bimodal size distribution, with a medium particle size of 1 to 4 microns (79 wt %) and submicron Ag suspension with a medium particle size of 0.2 to 0.6 microns. (5 wt %), the silver powder mixture 3 is a mixture of Ferro Ag powders with bimodal size distribution, with a medium particle size of 1 to 4 microns (83 wt %) and submicron Ag with a medium particle size of 0.2 to 0.6 microns. (1 wt %), and the silver powder mixture 4 is a mixture of spherical Ag particles having a median particle size of about 0.8 to 1.6 micron (81 wt %) and submicron Ag with a medium particle size of 0.2 to 0.6 microns. (3 wt %), all commercially available from Ferro Corporation, Cleveland, Ohio. The Pb-free glass A is a Pb-free glass with a Tg from 350 to 525° C. and the Pb-free glass B is a Pb-free glass with a Tg from 280 to 450° C. The leaded glass mixture 1 is two lead based glasses with Tg of 350° C. to 550° C. and the leaded glass 2 is a lead based glass with Tg of 280 to 450° C. The organo-vanadium compound is vanadium(IV) oxide bis(2,4-pentanedionate). The adhesive promoter is one metal oxide. The organic vehicle is a blend of Ethyl Cellulose Std. 4, 0.45 wt %; Ethyl Cellulose Std. 45, 1.28 wt %; Thixatrol® ST, 0.3 wt %; Triton® X-100, 0.18 wt %; N-Diffusol®, 0.5 wt %; Dowanol® DB, 8.45 wt %; and Terpineol, 3.84 wt %.

The paste compositions are printed using a 280 or 325 mesh screen with about 110 micron openings for front contact finger lines and about 2.5 mm spacing between the lines. Samples are dried at about 250° C. for about 3 minutes after printing the front contacts. The printed wafers are co-fired in air using a 6-zone infrared (IR) belt furnace from Despatch, with a belt speed of about 5 meters (200") per minute, with temperature set points of 880 to 940° C. in the last zone. The zones are 18", 18", 9", 9", 9" and 9" long, respectively. The fired finger width for most samples is about 80 to about 160 microns, and the fired thickness is about 10 to 50 microns.

Electrical performance of the solar cells is measured with a solar tester, Model NCT-M-180A, NPC Incorporated, Dumont, N.J., under AM 1.5 sun conditions, in accordance with ASTM G-173-03. The results of this electrical testing are presented in Tables 7 and 8. EFF means cell efficiency (η); and $R_S$ is previously defined.

TABLE 7

Paste Compositions in weight % and Electrical Properties.

| | Pastes | | | | | | | | | |
|---|---|---|---|---|---|---|---|---|---|---|
| | A1 | A2 | A3 | A4 | A5 | A6 | A7 | A8 | A9 | A10 |
| Ag powder A | 80.90 | 80.90 | 80.90 | 80.90 | 80.90 | 80.90 | 80.90 | 80.90 | 80.90 | 80.90 |
| Pb-free glass A | 4.87 | 4.77 | 4.37 | 4.07 | 4.87 | 4.87 | 4.87 | 4.87 | 4.87 | 4.87 |
| Pb-free glass B | 0 | 0 | 0 | 0 | 0.1 | 0.1 | 0.1 | 0.3 | 0.3 | 0.5 |
| VO(acac)2 | 0 | 0.1 | 0.5 | 0.8 | 0 | 0.1 | 0.3 | 0.1 | 0.3 | 0.2 |
| Adhesion promoter | 0.33 | 0.33 | 0.33 | 0.33 | 0.33 | 0.33 | 0.33 | 0.33 | 0.33 | 0.33 |
| Organic Vehicle | 13.9 | 13.9 | 13.9 | 13.90 | 13.8 | 13.7 | 13.5 | 13.5 | 13.3 | 13.2 |
| total | 100.00 | 100.00 | 100.00 | 100.00 | 100.00 | 100.00 | 100.00 | 100.00 | 100.00 | 100.00 |
| Rs (emitter 1) | 1 | 0.9989 | 1.5967 | 1.6137 | 1.3790 | 0.5951 | 1.1229 | 0.7556 | 0.6615 | |
| EFF (emitter 1) | 1 | 1.0868 | 0.9614 | 0.9513 | 1.0466 | 1.0139 | 0.8674 | 0.9769 | 0.9602 | |
| Rs (emitter 2) | 1 | | | | | 1.0853 | 1.2897 | 0.7630 | | 1.2122 |
| EFF (emitter 2) | 1 | | | | | 0.9979 | 0.9653 | 0.9782 | | 0.9605 |

TABLE 8

Paste Compositions in weight % and Electrical Properties.

| | Pastes | | | | | | | | | |
|---|---|---|---|---|---|---|---|---|---|---|
| | Reference paste | B1 | B2 | B3 | B4 | B5 | B6 | B7 | B8 | B9 |
| Ag powder mixture 1 | 84 | | | | | | | | | |
| Ag powder mixture 2 | | 84 | 84 | 84 | | | | | | |
| Ag powder mixture 3 | | | | | 84 | 84 | 84 | | | |
| Ag powder mixture 4 | | | | | | | | 84 | 84 | 84 |
| Leaded glass mixture 1 | 4.9 | 4.9 | 4.9 | 4.9 | 4.9 | 4.9 | 4.9 | | | |
| Leaded glass 2 | | | | | | | | 5.4 | 5.4 | 5.4 |
| Pb-free glass B | | | 0.1 | 0.1 | | 0.1 | | | 0.1 | |
| VO(acac)2 | | | | 0.2 | | 0.2 | 0.2 | | 0.2 | 0.2 |
| Organic Vehicle | 11.1 | 11.1 | 11 | 10.8 | 11.1 | 10.8 | 10.9 | 10.6 | 10.3 | 10.4 |
| total | 100 | 100 | 100 | 100 | 100 | 100 | 100 | 100 | 100 | 100 |
| Rs (emitter 3) | 1 | 1.0263 | 0.9618 | 0.9582 | 0.9773 | 0.8174 | | 0.7104 | 0.7108 | 0.6513 |
| EFF (emitter 3) | 1 | 1.0212 | 1.0311 | 1.0154 | 1.0372 | 1.0379 | | 1.1469 | 1.1606 | 1.1703 |
| Rs (emitter 4) | | | | | | 1.0000 | 0.9173 | | | |
| EFF (emitter 4) | | | | | | 1.0000 | 1.0672 | | | |

It will be appreciated that although the examples herein primarily concern a conductive composition for use in forming a conductor paste for in the formation of solar cell contacts, the present invention also contemplates the use of the principles disclosed herein to form resistor and semiconductor pastes, inks, tapes and the like. Furthermore, such compositions may or may not be considered as materials for use in forming thick films. Thus, applicants' unique conductive compositions can be utilized to form conductive, resistive or semiconducting paths or patterns on substrates. Such conductive composition can assume various forms including an ink, a paste, a tape and the like. Additionally, substrates other than silicon can be employed in connection with the pastes of the present invention. The use of the compositions disclosed herein is also envisioned in a variety of electronic components and devices.

What has been described above includes examples of the subject invention. It is, of course, not possible to describe every conceivable combination of components or methodologies for purposes of describing the subject invention, but one of ordinary skill in the art may recognize that many further combinations and permutations of the subject invention are possible. Accordingly, the subject invention is intended to embrace all such alterations, modifications and variations that fall within the spirit and scope of the appended claims. Furthermore, to the extent that the terms "contain,' "have," "include," and "involve" are used in either the detailed description or the claims, such terms are intended to be inclusive in a manner similar to the term "comprising" as "comprising" is interpreted when employed as a transitional word in a claim. In some instances, however, to the extent that the terms "contain,' "have," "include," and "involve" are used in either the detailed description or the claims, such terms are intended to be partially or entirely exclusive in a manner similar to the terms "consisting of" or "consisting essentially of" as "consisting of" or "consisting essentially of" are interpreted when employed as a transitional word in a claim.

What is claimed is:

1. A method of making a solar cell contact, comprising;
applying a paste to a silicon substrate, the paste comprising:
  silver particles at about 50 wt % or more and about 92 wt % or less of the paste composition;
  a glass frit portion at about 1 wt % or more and about 15 wt % or less of the paste composition; and
  a metal additive selected from the group consisting of vanadyl acetylacetonates present in an amount effective to reduce a resistance of the solar cell contact, wherein the amount of the metal additive is about 0.01 wt % to about 5 wt % of the paste; and
heating the paste to sinter the silver particles and fuse the glass frit.

2. The method of claim 1, wherein the paste composition comprises the metal additive at about 0.02 wt % or more and about 1 wt % or less of the paste composition.

3. The method of claim 1, wherein the paste further comprises one or more organo-metal compounds selected from the group consisting of vanadium alkoxides, vanadyl alkoxides, antimony alkoxides, and yttrium alkoxides.

4. The method of claim 1, wherein the paste further comprises one or more organo-metal compounds selected from the group consisting of vanadium acetylacetonates, antimony acetylacetonates, and yttrium acetylacetonates.

5. The method of claim 1, wherein the paste further comprises one or more organo-metal compounds selected from the group consisting of metal 2-methylhexanoate, metal 2-ethylhexanoate, and metal 2-propylhexanoate thereof, where the metal is vanadium, antimony, or yttrium.

6. The method of claim 1, wherein the paste further includes a second metal additive comprising one or more organo-metal compounds selected from the group consisting of a vanadium, antimony, phosphorus, yttrium, cobalt, nickel, zirconium, tin, zinc or lithium organo-metal compound.

7. A paste composition, comprising:
    silver at about 50 wt % or more and about 92 wt % or less of the paste composition;
    a glass frit portion at about 1 wt % or more and about 15 wt % or less of the paste composition; and
    a metal additive selected from the group consisting of vanadyl acetylacetonates in an amount effective to reduce a resistance of a solar cell contact formed from the paste composition, wherein the amount of the metal additive is about 0.01 wt % to about 5 wt % of the paste composition.

8. A solar cell contact formed by firing a paste composition according to claim 7.

9. The paste composition of claim 7, wherein the paste composition comprises the metal additive at about 0.02 wt % or more and about 3 wt % or less of the paste composition.

10. The paste composition of claim 7, wherein the paste further comprises one or more organo-metal compounds selected from the group consisting of vanadium alkoxides, vanadyl alkoxides, antimony alkoxides, and yttrium alkoxides.

11. The paste composition of claim 7, wherein the paste further comprises one or more organo-metal compounds selected from the group consisting of vanadium acetylacetonates, antimony acetylacetonates, and yttrium acetylacetonates.

12. The paste composition of claim 7, wherein the paste further comprises one or more organo-metal compounds selected from the group consisting of metal 2-methylhexanoate, metal 2-ethylhexanoate, and metal 2-propylhexanoate where the metal is vanadium, antimony, or yttrium.

13. The paste composition of claim 7, further including a second metal additive comprising one or more organo-metal compounds selected from the group consisting of a cobalt, nickel, zirconium, tin, zinc or lithium organo-metal compound, or mixtures thereof.

14. The paste composition of claim 7, wherein the silver comprises a mixture of spherical and flake shaped powders.

15. The paste composition of claim 7, wherein the silver comprises a mixture of irregular shape particles and colloidal silver.

16. The paste composition of claim 7, wherein said glass frit has the following composition:
    PbO 52-88 wt %; $SiO_2$ 0.5-15 wt %; $Al_2O_3$ 0.5-10 wt %; ZnO 0-22 wt %; $Ta_2O_5$ 0-8 wt %; $ZrO_2$ 0-10 wt %; $P_2O_5$ 0-8 wt %; $Li_2O+K_2O+Na_2O$ 0-15 wt %; $B_2O_3$ 0-12 wt %; and $Fe_2O_3+Co_2O_3+CuO+MnO_2$ 0-25 wt %, wherein all weight percentages are based upon 100% total weight of the glass frit portion.

17. The paste composition of claim 7 wherein said glass frit portion comprises a mixture of two or more glass frits.

18. The paste composition of claim 7 wherein said glass frit portion is cadmium-free and lead-free.

19. The paste composition of claim 18, wherein said glass frit portion includes the following composition:
    $Bi_2O_3+SiO_2$ 30-62 wt %; ZnO 0-34 wt %; $TiO_2$ 0-22 wt %; $Li_2O$ 0-10 wt %; $Na_2O$ 0-23 wt %; $K_2O$ 0-13 wt %; $P_2O_5$ 0-10 wt %; $Sb_2O_5+V_2O_5$ 0-13 wt %; $ZrO_2$ 0-8 wt %; F 0-5 wt %; and $Fe_2O_3+Co_2O_3+CuO+MnO_2$ 0-25 wt %, wherein all weight percentages are based upon 100% total weight of the glass frit portion.

20. The paste composition of claim 7 wherein said glass frit portion includes the following composition:
    $Bi_2O_3$ 55-99 wt %; $B_2O_3$ 1-15 wt %; $SiO_2$ 0-20 wt %; ZnO 0-13 wt %; $K_2O$ 0-12 wt %; $Li_2O$ 0-10 wt %; $Nb_2O_5+Ta_2O_5$ 0-10 wt %; and $Fe_2O_3+Co_2O_3+CuO+MnO2$ 0-25 wt %, wherein all weight percentages are based upon 100% total weight of the glass frit portion.

* * * * *